United States Patent
Onodera et al.

(10) Patent No.: US 7,285,848 B2
(45) Date of Patent: Oct. 23, 2007

(54) CARRIER FOR STACKED TYPE SEMICONDUCTOR DEVICE AND METHOD OF FABRICATING THE SAME

(75) Inventors: Masanori Onodera, Tokyo (JP); Junichi Kasai, Kanagawa (JP); Kouichi Meguro, Tokyo (JP); Junji Tanaka, Tokyo (JP); Yasuhiro Shinma, Kanagawa (JP); Koji Taya, Kanagawa (JP)

(73) Assignee: Spansion LLC, Sunnyvale, CA (US)

( * ) Notice: Subject to any disclaimer, the term of this patent is extended or adjusted under 35 U.S.C. 154(b) by 131 days.

(21) Appl. No.: 11/126,739

(22) Filed: May 11, 2005

(65) Prior Publication Data

US 2005/0269682 A1   Dec. 8, 2005

Related U.S. Application Data

(63) Continuation of application No. PCT/JP2004/006265, filed on May 11, 2004.

(51) Int. Cl.
*H01L 23/02* (2006.01)

(52) U.S. Cl. ........................ 257/686; 257/777
(58) Field of Classification Search ............ 257/686, 257/777, 734–738, E23.066
See application file for complete search history.

(56) References Cited

U.S. PATENT DOCUMENTS

| | | | |
|---|---|---|---|
| 6,190,944 B1 | 2/2001 | Choi | 438/109 |
| 6,700,783 B1 * | 3/2004 | Liu et al. | 361/704 |
| 6,906,407 B2 * | 6/2005 | Byers et al. | 257/686 |
| 2001/0048152 A1 * | 12/2001 | Moden et al. | 257/686 |
| 2002/0017709 A1 | 2/2002 | Yanagisawa | 257/686 |
| 2004/0227222 A1 * | 11/2004 | Kikuchi et al. | 257/686 |
| 2005/0161793 A1 * | 7/2005 | Ohno et al. | 257/686 |
| 2006/0049504 A1 * | 3/2006 | Corisis et al. | 257/686 |
| 2006/0170091 A1 * | 8/2006 | Karnezos | 257/686 |
| 2006/0220212 A1 * | 10/2006 | Chen et al. | 257/686 |

FOREIGN PATENT DOCUMENTS

| | | |
|---|---|---|
| JP | 06-013541 | 1/1994 |
| JP | 08-236694 | 9/1996 |
| JP | 2000-216333 A | 8/2000 |
| JP | 2001-352035 A | 12/2001 |
| JP | 2003-218273 | 7/2003 |

* cited by examiner

*Primary Examiner*—Nathan W. Ha

(57) ABSTRACT

A carrier for a stacked type semiconductor device includes a lower carrier having a first accommodating portion that accommodates a first semiconductor device, and an upper carrier having a second accommodating portion that accommodates a second semiconductor device stacked on the first semiconductor device so as to be placed in position on the first semiconductor device. It is thus possible to eliminate an additional device used for stacking the semiconductor device, and thereby reduce the cost.

10 Claims, 15 Drawing Sheets

CARRIER FOR STACKED TYPE SEMICONDUCTOR DEVICE AND METHOD OF FABRICATING THE SAME

CROSS REFERENCE TO RELATED APPLICATIONS

This is a continuation of International Application No. PCT/JP2004/006265, filed May 11, 2004.

BACKGROUND OF THE INVENTION

1. Field of the Invention

The present invention relates to a carrier for a stacked type semiconductor device and a method of fabricating the stacked type semiconductor device.

2. Description of the Related Art

In recent years, mobile electronics devices such as mobile telephones and IC memory cards such as non-volatile memory media have been downsized, and the number of the parts mounted on those devices is demanded to be reduced and those parts are demanded to be downsized.

A semiconductor device is a main component among those parts composing the above-mentioned devices. Accordingly, the technique for effectively packaging the semiconductor device is highly demanded. A stacked type package is known as one of the packages that satisfy the aforementioned demand. The stacked type package is a package, for example, into which one package for memory and the other package for logic are stacked. The method of fabricating the stacked type semiconductor device is disclosed in the following three Documents.

Document 1: Japanese Patent Application Publication No. 8-236694

Document 2: Japanese Patent Application Publication No. 2003-218273

Document 3: Japanese Patent Application Publication No. 6-13541

It is to be noted that a mounting device used for stacking the package has to be prepared for fabricating the stacked type semiconductor device. An equipment investment for the aforementioned device is necessary, and this is a cause to inhibit the reduction of the production cost. If the production amount is relatively small, there will arise a problem in that the equipment investment is a big burden in view of cost. Any one of the above-mentioned Document 1 through 3 does not describe the effective technique for reducing the production cost.

The fabrication of the stacked type semiconductor device has a manufacturing stream. The manufacturing stream starts from receiving the logic device, the memory device, the package for the logic device, or the package for the memory device from a semiconductor device manufacturer. The received packages are stacked and assembled in a stacked type semiconductor manufacturer. Then, the stacked type semiconductor device is shipped.

When the logic device is supplied from the semiconductor device manufacturer, for example, the logic device and the memory device are respectively packaged and then only the package for logic device is returned to the semiconductor device manufacturer, which is an original manufacture. The test is performed in the original manufacturer, and only good products are transported again. Then, two packages are stacked and incorporated into one body. Appearance test and operation test are implemented so that only good products can be shipped.

Generally, the package is transported by directly accommodating the package in a tray. In the semiconductor device manufacturer to which the package is returned, however, the package is take out of the tray for testing and then the package is accommodated in the tray again after the testing. The package in the tray is transported to the stacked type semiconductor manufacturer.

In other words, there will be more chances to generate a defective product, as the number of times of handling the package is more increased. A higher rate of occurrence of the defective product will increase the manufacturing cost.

SUMMARY OF THE INVENTION

The present invention has been made in view of the above circumstances and has an object of providing a carrier for a stacked type semiconductor device and a method of fabricating the stacked type semiconductor device to reduce the production cost as much as possible.

According to an aspect of the present invention, preferably, there is provided a carrier for a stacked type semiconductor device including: a lower carrier having a first accommodating portion that accommodates a first semiconductor device; and a upper carrier having a second accommodating portion that accommodates a second semiconductor device stacked on the first semiconductor device so as to be placed in position on the first semiconductor device.

The second semiconductor device is stacked on the first semiconductor device. The upper carrier includes the second accommodating portion so as to locate the second semiconductor device on a give position of the first semiconductor device. It is thus possible to stack the semiconductor devices without misalignment. Additional equipment is not necessary for stacking the semiconductor devices, and the cost can be reduced.

The carrier may further include an opening for making an electrical connection between the first semiconductor device and pins for testing.

The pins for testing and the first semiconductor device accommodated in the lower carrier can establish an electrical connection, and the testing can be performed on the semiconductor device with accommodated in the carrier. Thus, the semiconductor device does not have to be removed from the carrier for testing, and the time to touch the semiconductor device can be reduced.

On the above carrier, the lower and upper carriers may have respective engaging portions that engage each other so that the lower and upper carriers are detachably attached to each other.

The carrier is composed of the upper carrier and the lower carrier, which can be attached and detached. Therefore, only the necessary carrier can be used. That is, if only the lower carrier is attached before testing, the whole device configuration does not become so big and does not take much space. When the semiconductor devices are stacked, the stacked semiconductor device can be protected by stacking the upper carrier on the lower carrier.

On the above carrier, the second accommodating portion of the upper carrier may have an inserting opening through which the second semiconductor device is accommodated in the upper carrier; and the inserting opening gradually becomes wider towards an upper end of the inserting opening.

With this configuration, the semiconductor device can be inserted into the inserting opening, and the operational performance can be improved.

On the above carrier, the lower carrier may comprise a hold member made of an elastic material, the hold member holding the first semiconductor device in the first accommodating portion.

The first semiconductor device is accommodated in the first accommodating portion with the hold members made of an elastic material, and the semiconductor device can be protected from the stress of attaching to or detaching from the carrier.

On the above carrier, the hold member may hold side edges of the first semiconductor device.

The hold members hold the first semiconductor device accommodated in the first accommodating portion by the side edges. Thus, the stress applied to the semiconductor device can be alleviated.

On the above carrier, the upper and lower carriers may comprise one of a metal containing one of aluminum, copper or nickel, ceramic and polyetherketone resin.

The carrier is composed of the aforementioned material, and reflow soldering can be performed on the semiconductor device with accommodated in the carrier.

The carrier may further include one of an upper lid and a ring member, wherein the lower carrier has a groove for attaching one of the upper lid and the ring member to the lower carrier.

The upper lid provided on the semiconductor device is capable of protecting the electrical connection from dusts or skin oil. The upper lid or the ring material arranged immediately above the semiconductor device is capable of preventing the semiconductor device from dropping off.

According to another aspect of the present invention, preferably, there is provided a method of fabricating a stacked type semiconductor device including the steps of: placing a first semiconductor device in a lower carrier of a stacked type semiconductor device carrier; and stacking a second semiconductor device on the first semiconductor device by using an upper carrier of the stacked type semiconductor device carrier. Thus, it is possible to stack two semiconductor devices with excellent operational performance and with accuracy. On the above method, the step of stacking may include the steps of attaching the upper carrier to the lower carrier; and then placing the second semiconductor device in the upper carrier.

The method may include the step of making an electrical connection between the first and second semiconductor devices accommodated in the stacked type semiconductor device carrier in a reflow chamber so that the first and second semiconductor devices are incorporated. The semiconductor device is accommodated in the carrier, and the carrier is placed in the reflow chamber to connect the semiconductors. This can reduce the frequency of touching the semiconductor device, and can prevent the malfunction of the semiconductor device. The carrier does not have to be removed until the stacked type semiconductor device is manufacture red, and the semiconductor device can be protected and the quality can be maintained.

The method may further include a step of removing the upper carrier before the stacked type semiconductor device carrier is placed in the reflow chamber.

Before starting the reflow soldering, the upper carrier is removed so as to reduce the whole thermal capacity. This can prevent a problem of insufficient melting caused by insufficient temperature.

The method may further include a step of connecting pins for testing to the first semiconductor device through an opening of the lower carrier and testing the first semiconductor carrier accommodated in the lower carrier. The semiconductor can be tested with accommodated in the carrier. The semiconductor device does not have to be removed for every test, and the chance to touch the semiconductor device can be reduced.

The method further includes a step of supplying an adhesive on a sealing resin of the first semiconductor device before the step of stacking. Thus, the semiconductor device can be connected and fixed surely.

On the above method, the sealing resin is thermosetting resin. The curing temperature and curing period can be selected according to the specifications of the semiconductor device, by employing the adhesive of thermosetting property.

The present invention is capable of reducing the production cost of the stacked type semiconductor device.

DESCRIPTION OF THE PREFERRED EMBODIMENTS

A description will now be given, with reference to the accompanying drawings, of embodiments of the present invention.

Figure 1:
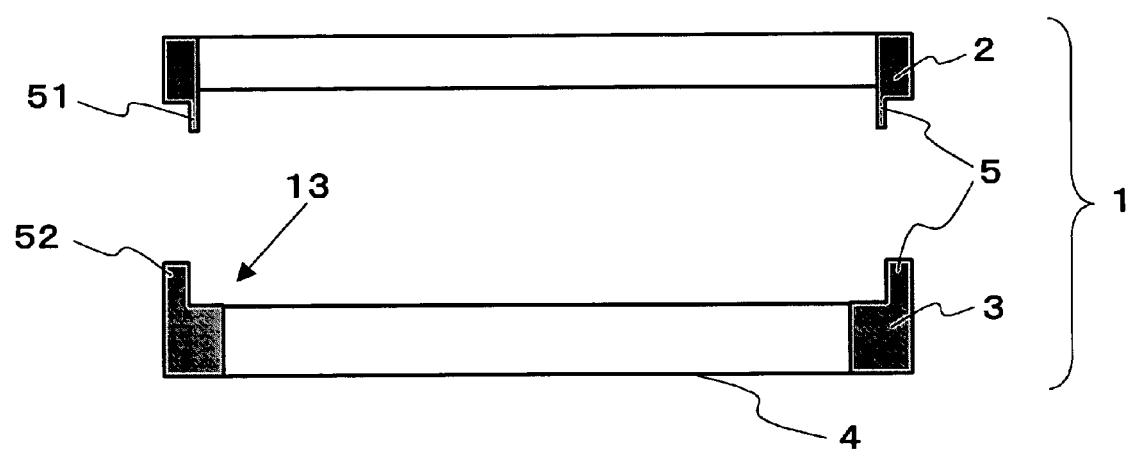
FIG. 1 shows a configuration of an upper carrier 2 and a lower carrier 3.
Figure 2A:
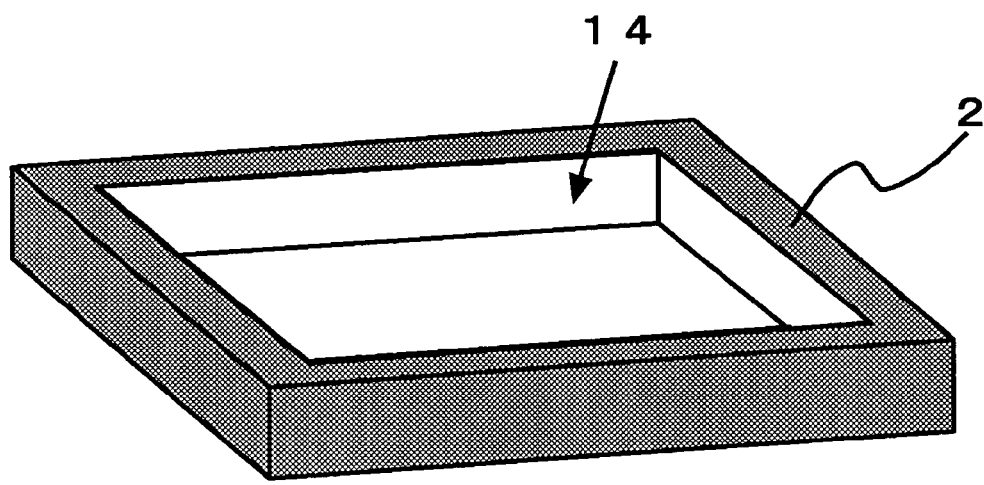
FIG. 2A shows a second accommodating portion 14 in the upper carrier 2.
Figure 2B:
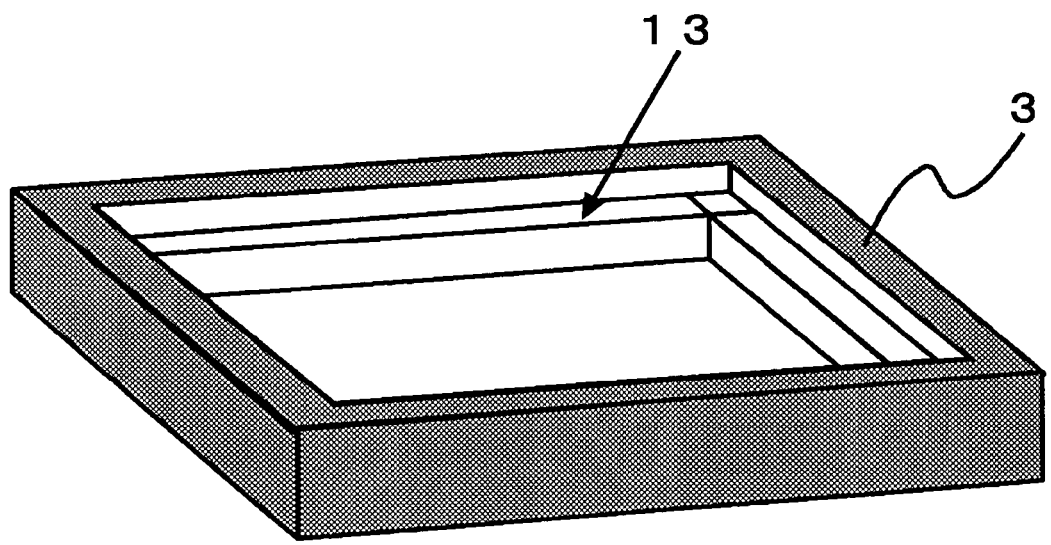
FIG. 2B shows a first accommodating portion 13 in the lower carrier 3.

A description will be given of a carrier for a stacked type semiconductor device. Referring to FIG. 1, a carrier for a stacked type semiconductor device 1 (hereinafter referred to as carrier) includes an upper carrier 2 and a lower carrier 3 in accordance with an embodiment of the present invention. The upper carrier 2 has a top face of a rectangular and has an opening therein. Referring to FIG. 2A, a second accommodating portion 14 is provided for accommodating the semiconductor device. Referring to FIG. 2B, a first accommodating portion 13 is provided in the lower carrier 3. An opening 4 is formed on a bottom face of the first accommodating portion 13 so as to connect pins for testing.

The upper carrier 2 and the lower carrier 3 are made of a plastic including one of a metal containing one of aluminum, copper or nickel such as SUS, ceramic and polyetherketone resin (PEEK material). The upper carrier 2 and the lower carrier 3 surround the stacked semiconductor device, and the reflow soldering is later performed. Therefore, heat resistance and high conductance are required for the carrier 1. Also, the carrier 1 is demanded not to be degraded even after repeatedly used.

Engaging portions 5 are respectively provided on edges of the bottom face of the upper carrier 2 and the top face of the lower carrier 3, as shown in FIG. 1. A protrusion 51 provided on the upper carrier 2 is fit with the inside of a protrusion 52 provided on the lower carrier 3, as shown in FIG. 1. The upper carrier 2 and the lower carrier 3 are thus fixed.

Figure 3:
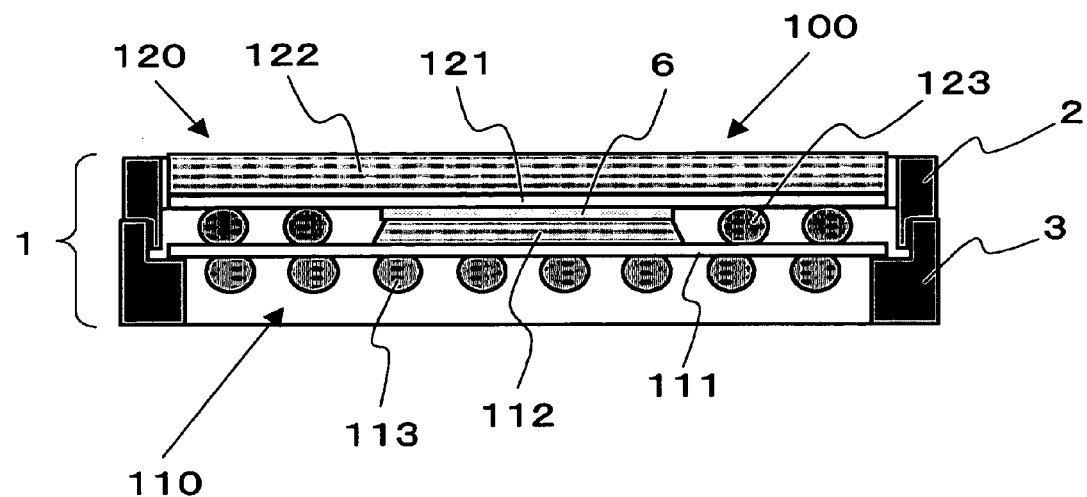
FIG. 3 shows a stacked type semiconductor device 100 accommodated in the carrier 1 comprising the upper carrier 2 and the lower carrier 3.
Figure 4:
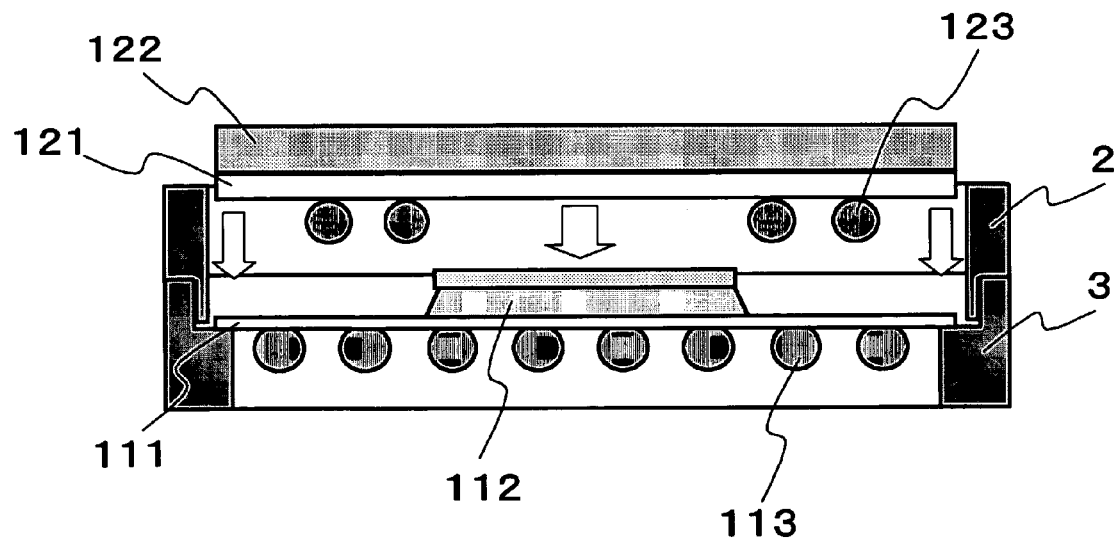
FIG. 4 shows a second semiconductor device 120 is stacked on a first semiconductor device 110 with a guiding function of the upper carrier 2.

FIG. 3 shows a stacked type semiconductor device 100 accommodated in the carrier 1 comprising the upper carrier 2 and the lower carrier 3. The stacked type semiconductor device 100 has a two-layered structure having a second semiconductor device 120 stacked on a first semiconductor device 110. In order to attach the carrier 1 to the stacked type semiconductor device 100, first, the first semiconductor device 110 is accommodated in the first accommodating portion 13 of the lower carrier 3, and the lower carrier 3 and the upper carrier 2 are fixed together by the engaging portions 5. Next, referring to FIG. 4, the second semiconductor device 120 is stacked on the first semiconductor device 110 through the upper carrier 2 having the opening therein. The first semiconductor device 110 and the second semiconductor device 120 can be located to make an electrical connection, by accommodating the second semiconductor device 120 in the second accommodating portion 14 along an inner surface of the upper carrier 2. The upper carrier 2 servers as a guiding function in this manner, special equipment exclusively used for stacking the semiconductor device is not necessary, and thereby it is possible to reduce the cost.

In the first semiconductor device 110, an IC chip that is not shown is mounted on a surface of a substrate 111, and the IC chip is sealed with a mold resin 112, as shown in FIG. 3. Solder balls 113 are provided on a backside of the substrate 111 so as to connect the pins for testing of a testing probe or another substrate. Also in the second semiconductor device 120, the IC chip is mounted on a surface of a relay substrate 121, and the whole surface of the relay substrate 121 is sealed with the mold resin. Solder balls 123 are provided on a backside of the relay substrate 121 so as to establish an electrical connection between the first semiconductor device 110 and the second semiconductor device 120, as shown in FIG. 3. Also shown in FIG. 3, the first semiconductor device 110 and the second semiconductor device 120 are bonded and fixed together with an adhesive 6.

Figure 5:
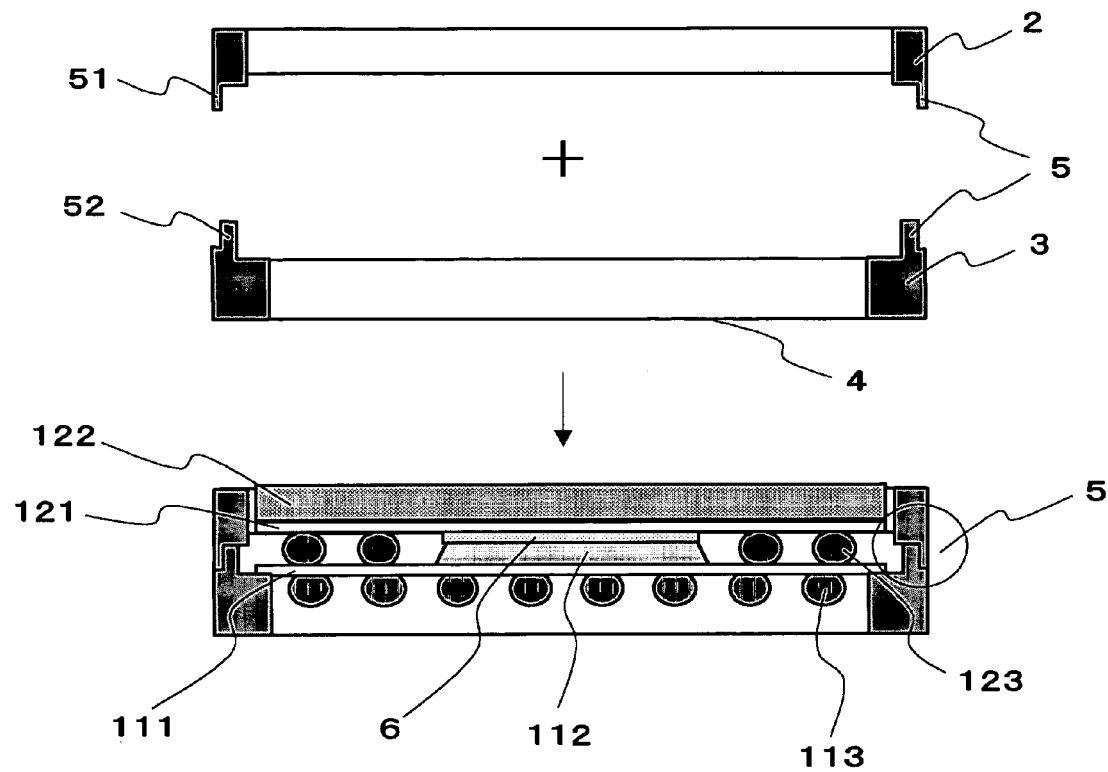
FIG. 5 shows another configuration of engaging portions provided on the upper carrier 2 and the lower carrier 3.
Figure 6:
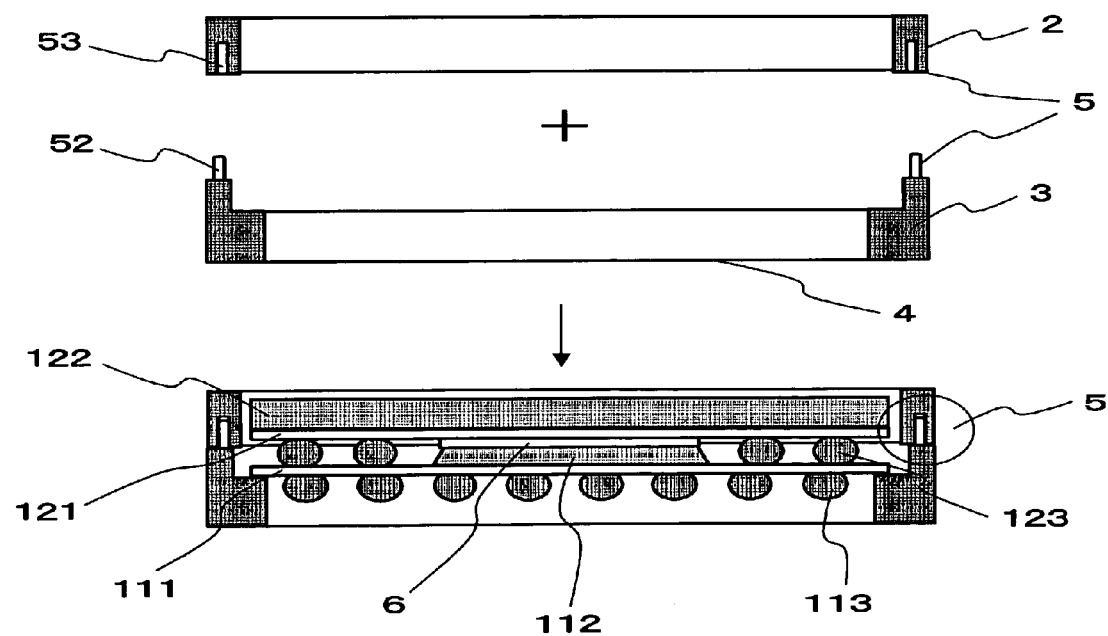
FIG. 6 shows another configuration of engaging portions provided on the upper carrier 2 and the lower carrier 3.

The configuration of the engaging portions 5 provided on the upper carrier 2 and the lower carrier 3 is not limited to that shown in FIG. 1. The engaging portions 5 may be configured as shown in FIG. 5 or 6. On the engaging portions 5 shown in FIG. 5, the protrusion 52 provided on the lower carrier 3 is fit inside the protrusion 51 provided on the upper carrier 2 so as to fix the upper carrier 2 and the lower carrier 3. On the engaging portions 5 shown in FIG. 6, a groove 53 is provided on the upper carrier 2 so that the protrusion 52 provided on the lower carrier 3 may be inserted into the groove 53 of the upper carrier 2.

Figure 7:
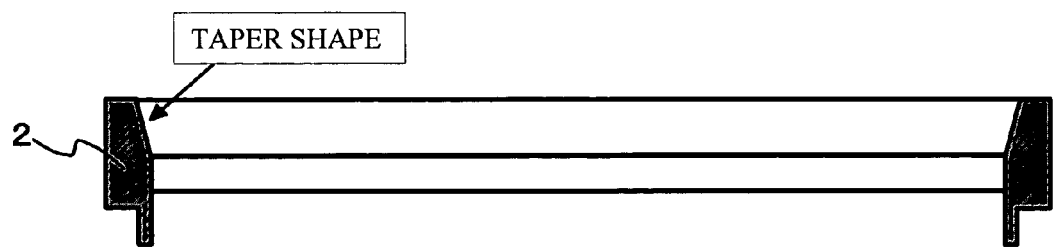
FIG. 7 shows another configuration of the upper carrier 2 having a taper to widen an inserting opening.

Referring to FIG. 7, an inserting opening of the second accommodating portion 14 of the upper carrier 2 may gradually become wider towards an upper end of the inserting opening. That is to say, the inserting opening becomes wider as closer to the upper end. With this taper-shaped inserting opening, the semiconductor device can be inserted easily and the operational performance can be improved.

Figure 8:
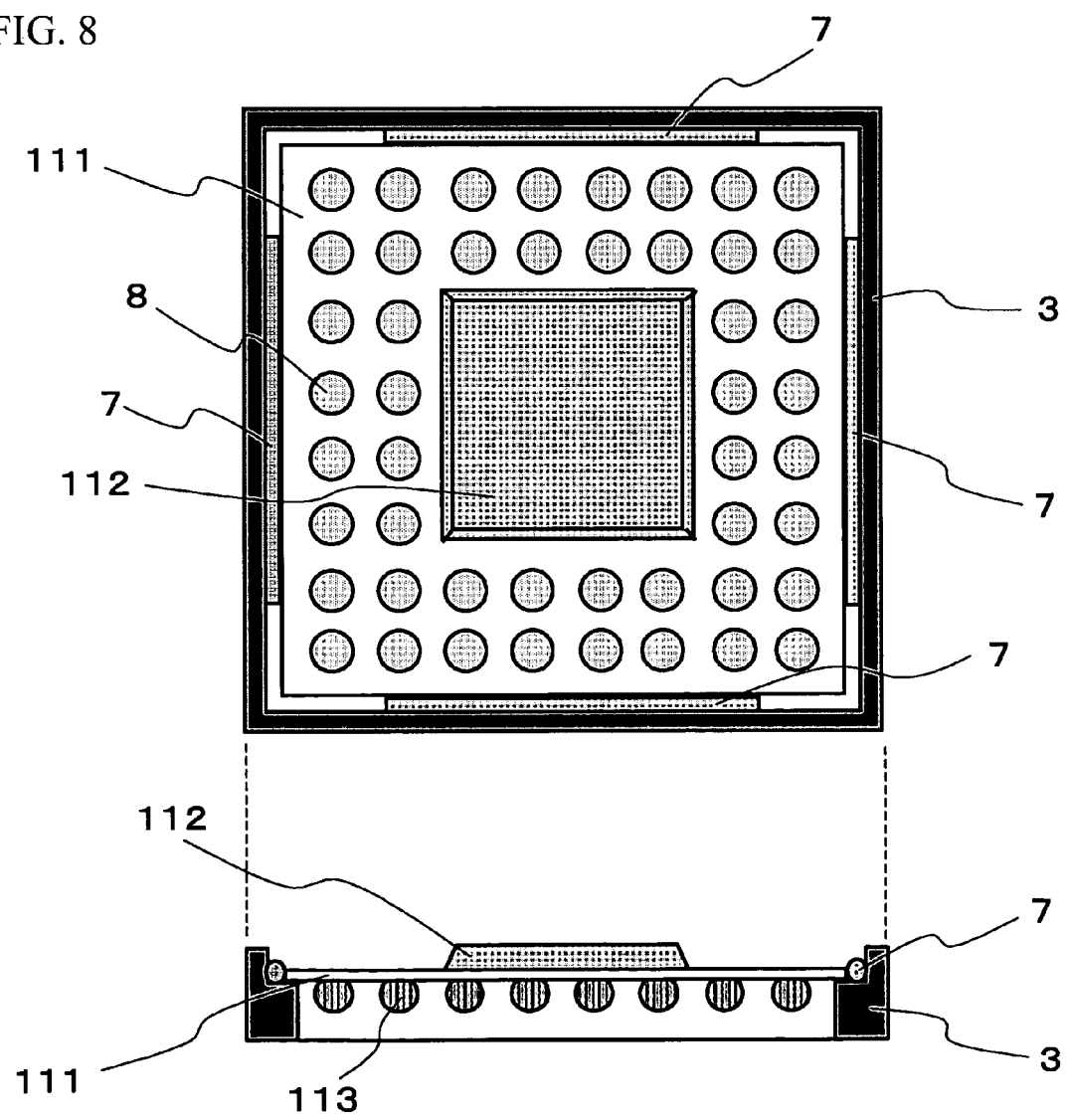
FIG. 8 is a top view and a cross-sectional view of the first semiconductor device 110 accommodated in the lower carrier 3.

FIG. 8 shows a top view and a cross-sectional view of the first semiconductor device 110 accommodated on the lower carrier 3. The substrate 111, as shown in the top view of FIG. 8, is placed on hold members 7 provided on four sides of the lower carrier 3, and is held on the lower carrier 3. The relay substrate having a thickness of less than 0.3 mm is used for the stacked type semiconductor device 100 so as to reduce the thickness of the semiconductor device. If the relay substrate is thin, corners of the relay substrate are subjected to stress. This stress originating from the corners possibly causes damage to a solder joint portion. In particular, the solder joint portion could be broken when the semiconductor device is attached to or detached from the carrier. Therefore, the hold members 7 are arranged on the side edges to which less stress is applied, instead of the weak corners against stress in accordance with an embodiment of the present invention. Thus, the semiconductor device is protected from the stress when detached from the carrier. In other words, the four corners are not in contact with anything. The hold member 7 is made of an elastic material that is elastically deformed when the semiconductor device is inserted such as silicon, rubber, or polyurethane.

In the embodiment of the present invention shown in FIG. 8, the hold members 7 are provided on the four sides. However, the hold members 7 may be provided on two sides so as to hold the semiconductor device.

Gold electrode pads 8 are formed on the substrate 111 as shown in the top view of FIG. 8. The first semiconductor device 110 and the second semiconductor device 120 are electrically connected by making the gold electrode pads 8 come into contact with the solder balls 123 provided on the backside of the second semiconductor device 120. The IC chip that is not shown and the mold resin 112 are provided on the substrate 111. The mold resin 112 seals the IC chip. Any shock or scratch occurred on the IC chip can be prevented by sealing the IC chip with the mold resin 112. Epoxy, silicon, or polyamide is used for the mold resin 112. The solder balls 113 are provided on the opposite surface of the substrate 111. The solder balls 113 serve as connection terminals when the stacked type semiconductor device 100 is mounted on the substrate.

Figure 9:
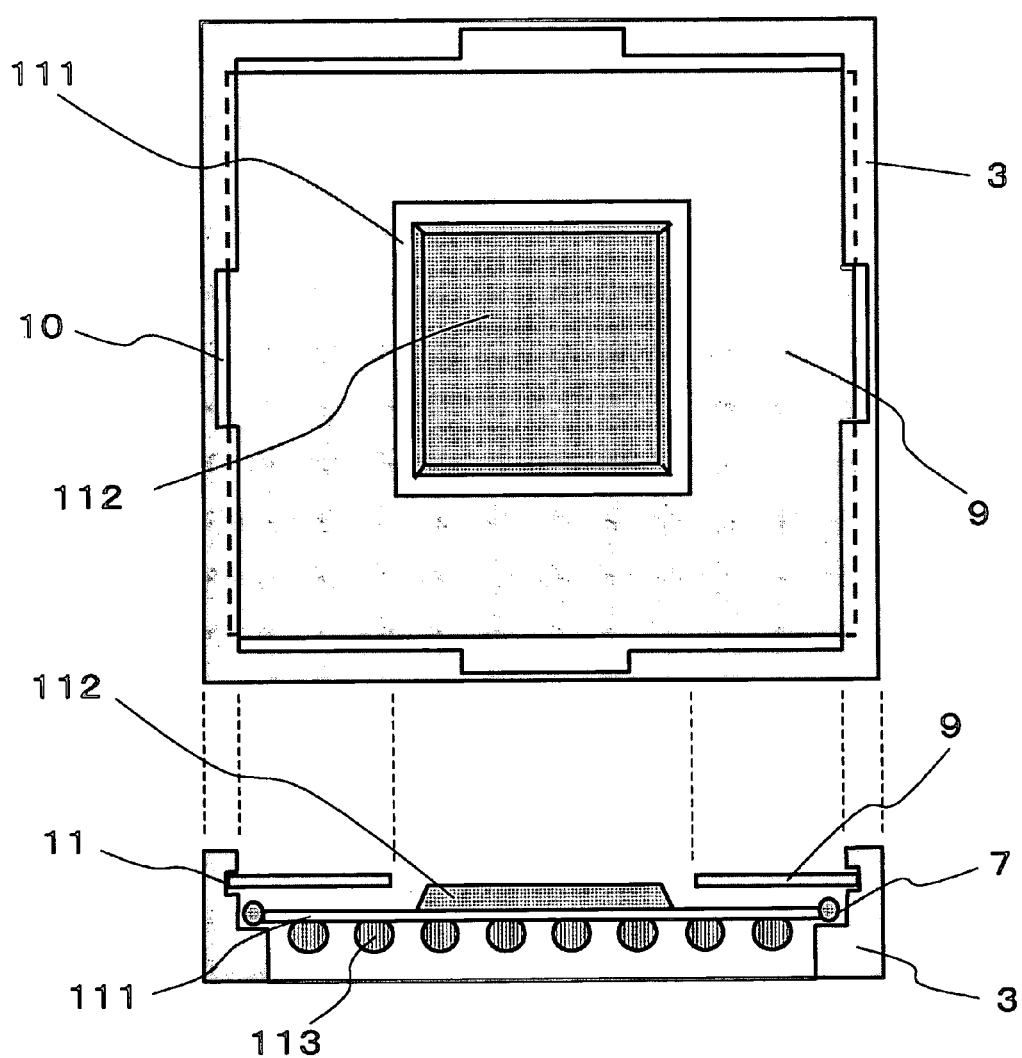
FIG. 9 is a top view and a cross-sectional view of the lower carrier 3 having an upper lid 9 thereon.

An upper lid 9 is provided on a top face of the first semiconductor device 110 accommodated in the lower carrier 3, as shown in FIG. 9. An inserting groove 11 is formed on an inner surface of the lower carrier 3, as shown in the cross-sectional view of FIG. 9. The upper lid 9 is inserted into the inserting groove 11. The gold electrode pads 8 and interconnection patterns are formed on the substrate 111 of the first semiconductor device 110, as shown in FIG. 8. The upper lid 9 is capable of protecting the electrically connecting portions from dusts or skin oil. In addition, the upper lid 9 is provided immediately above the substrate 111, and holds down from the top to prevent the first semiconductor device 110 from dropping off.

Figure 10:
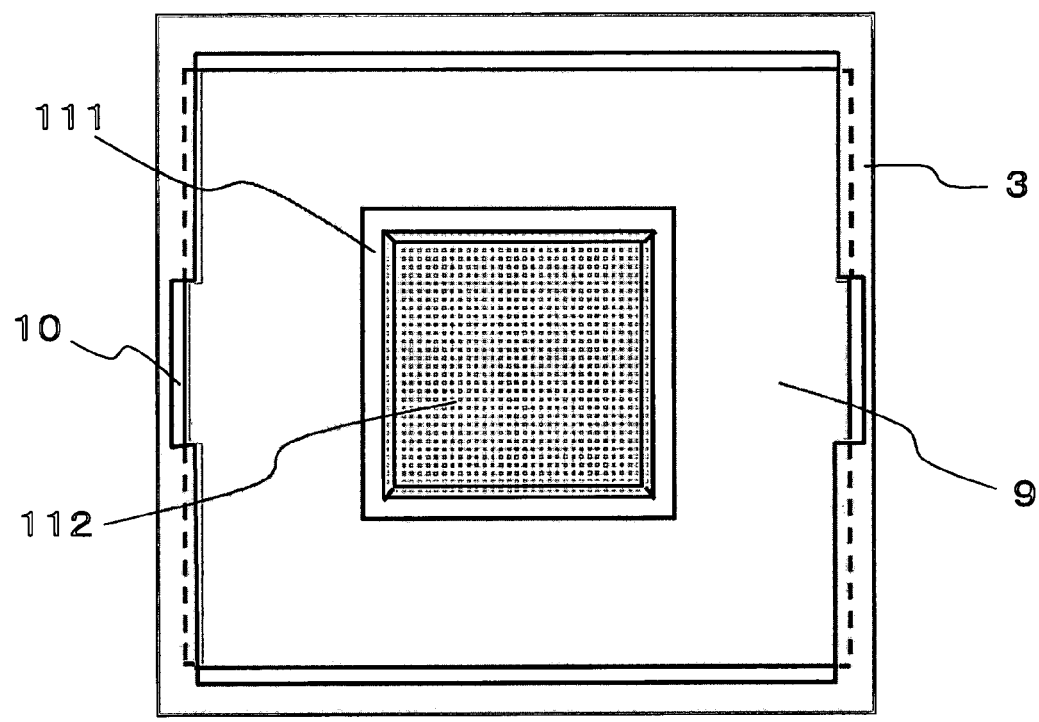
FIG. 10 shows an example of two cutout portions provided on two sides to remove the upper lid 9.

Further, cutout portions 10 are arranged on the four sides of the lower carrier 3 so as to take out the upper lid 9 inserted into the inserting groove 11 of the lower carrier 3, as shown in the top view of FIG. 9. The upper lid 9 is bent and inserted into the inserting groove 11. Therefore, the upper lid 9 is made of a material that can be bent, for example, a thin metal plate or plastic plate. When the upper lid 9 is taken out of the inserting groove 11, a special tool or a finger is inserted into the cutout portions 10 to take out the upper lid 9 from the groove. The cutout portions 10 are not necessarily provided on all the four sides of the lower carrier 3. For example, the cutout portions 10 may be provided on two sides of the lower carrier 3, as shown in FIG. 10.

Figure 11:
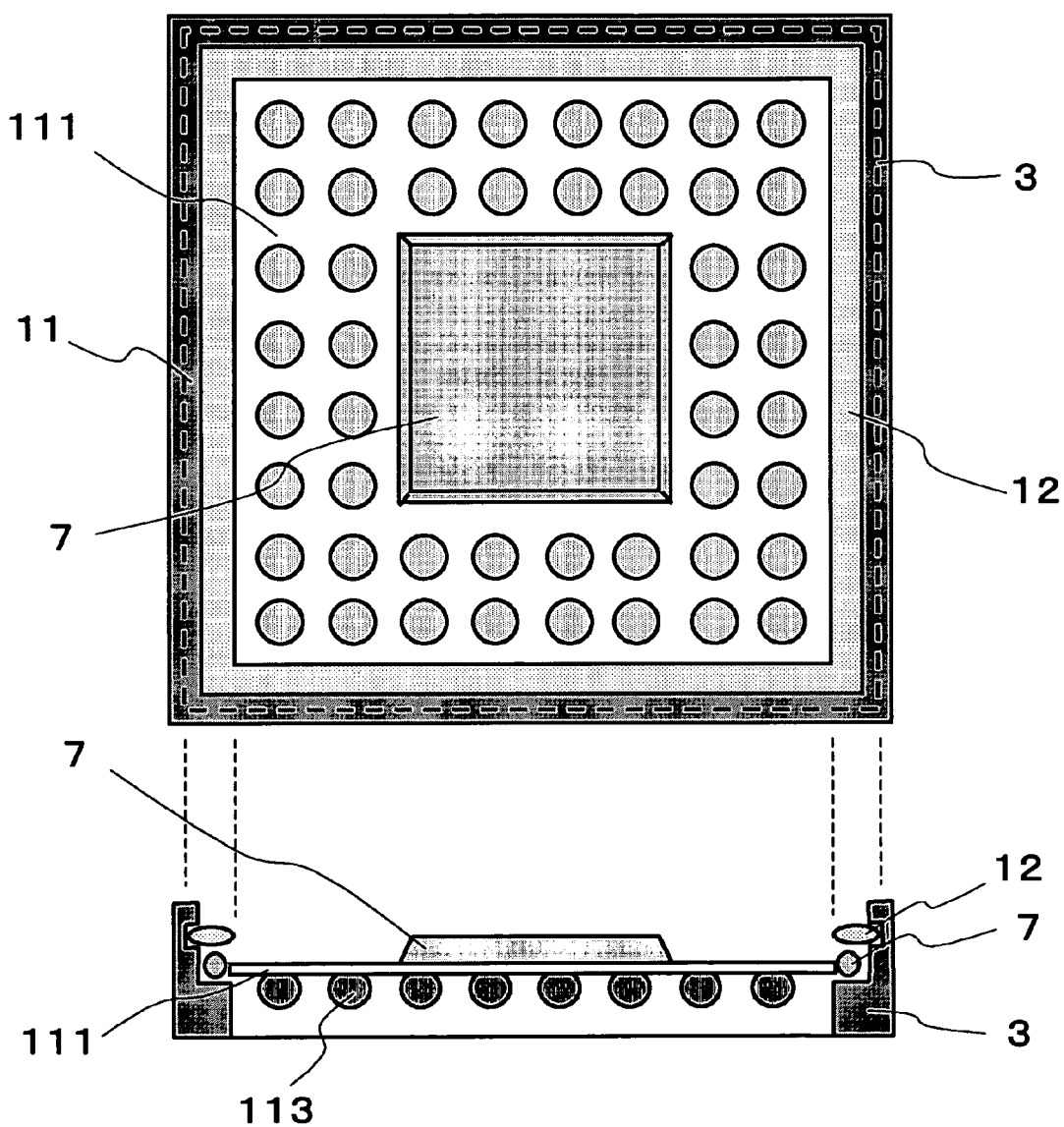
FIG. 11 is a top view and a cross-sectional view of the first semiconductor device 11 having an O-ring 12 thereon.

FIG. 11 shows an example of an O-ring 12 is attached other than the upper lid 9. The O-ring 12 does not have capabilities of protecting the electrodes or the interconnection patterns provided on the substrate 111 against the ducts or skin oil. However, as shown in FIG. 11, the O-ring 12 also pushes down from the top by providing immediately above the substrate 111 same as the upper lid 9, and prevents the first semiconductor device 110 from dropping off.

Figure 12:
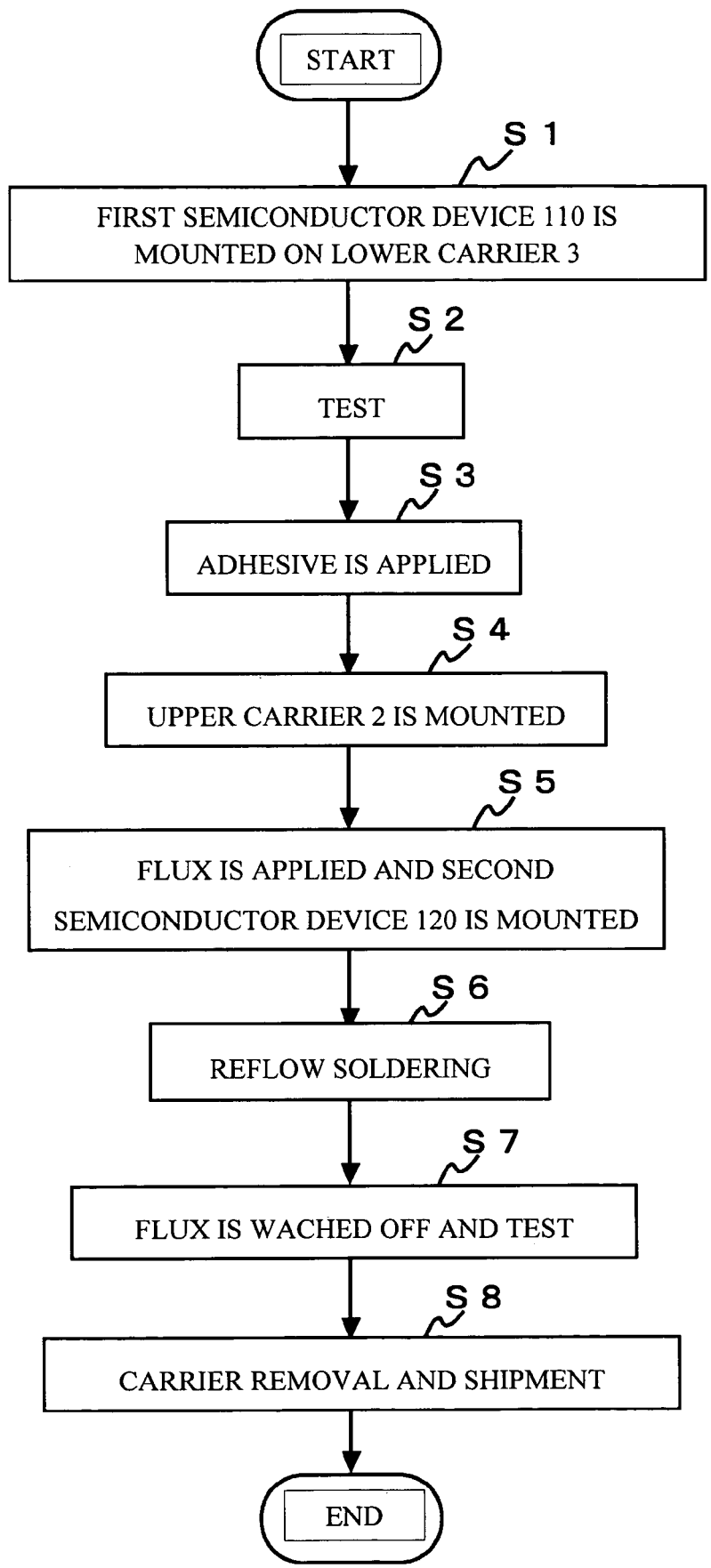
FIG. 12 is a flowchart showing a manufacturing process of the stacked type semiconductor device.

Next, a description will be given of a first example of a manufacturing procedure of the stacked type semiconductor device 100, with reference to a flowchart shown in FIG. 12.

Figure 13:
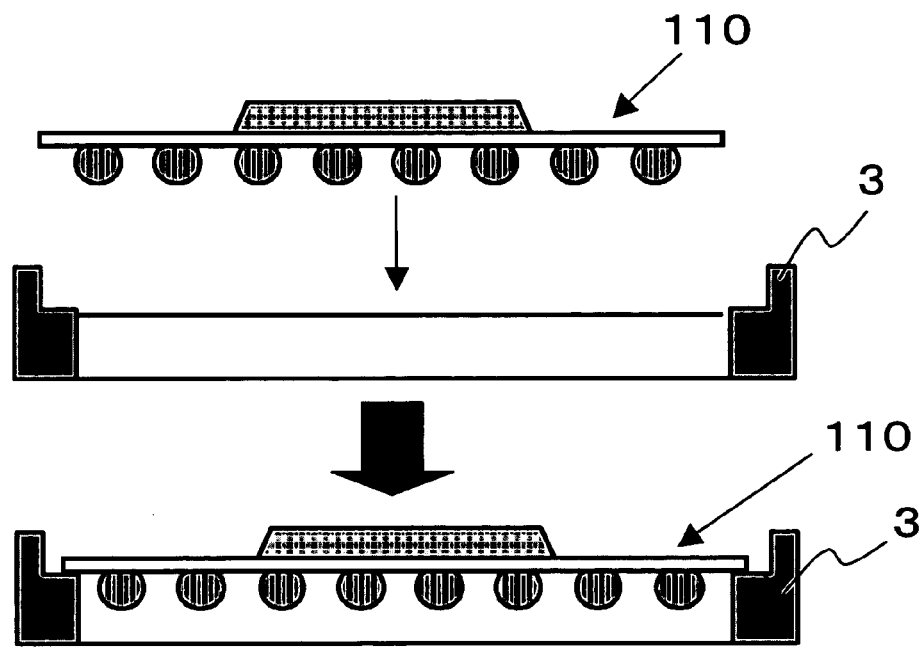
FIG. 13 shows the first semiconductor device 110 mounted on the lower carrier 3.

First, referring to FIG. 13, the first semiconductor device 110 is accommodated in the lower carrier 3 (step S1). Precisely, the first semiconductor device 110 is accommodated in the lower carrier 3 after the production of the semiconductor device. In order to manufacture the stacked type semiconductor device 100 after the semiconductor device is supplied, the supplied semiconductor device is accommodated in the lower carrier 3, and then the semiconductor device accommodated in the lower carrier 3 is transported to the original manufacturer of the semiconductor device.

Figure 14:
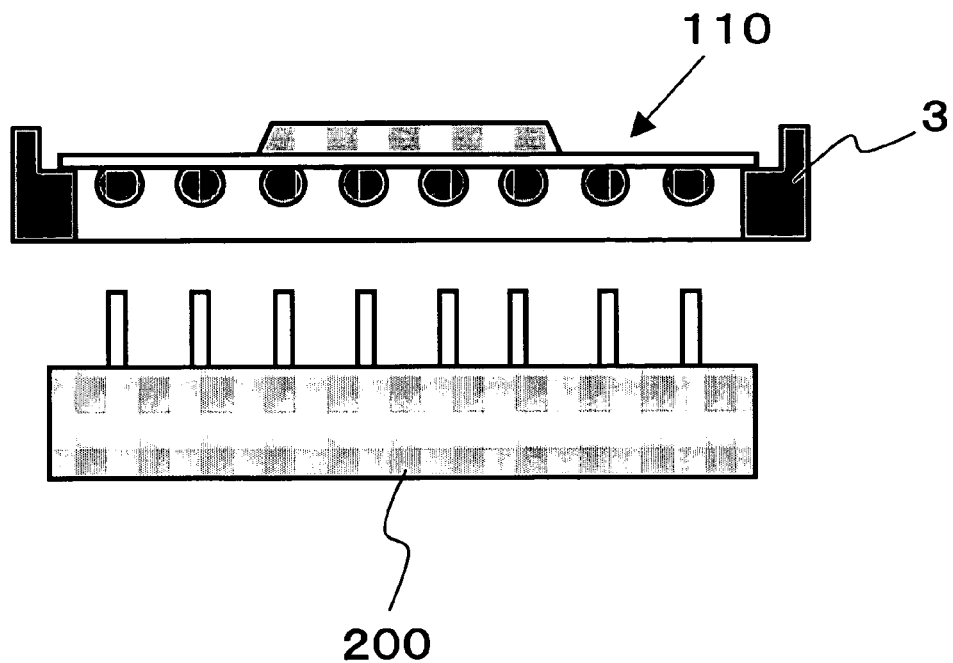
FIG. 14 is a view showing a test with a probe.
Figure 15:
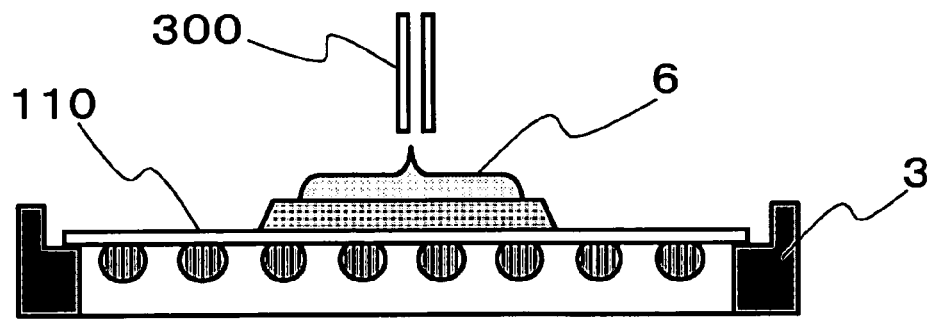
FIG. 15 is a view of an adhesive applied on a mold resin 112.
Figure 16:
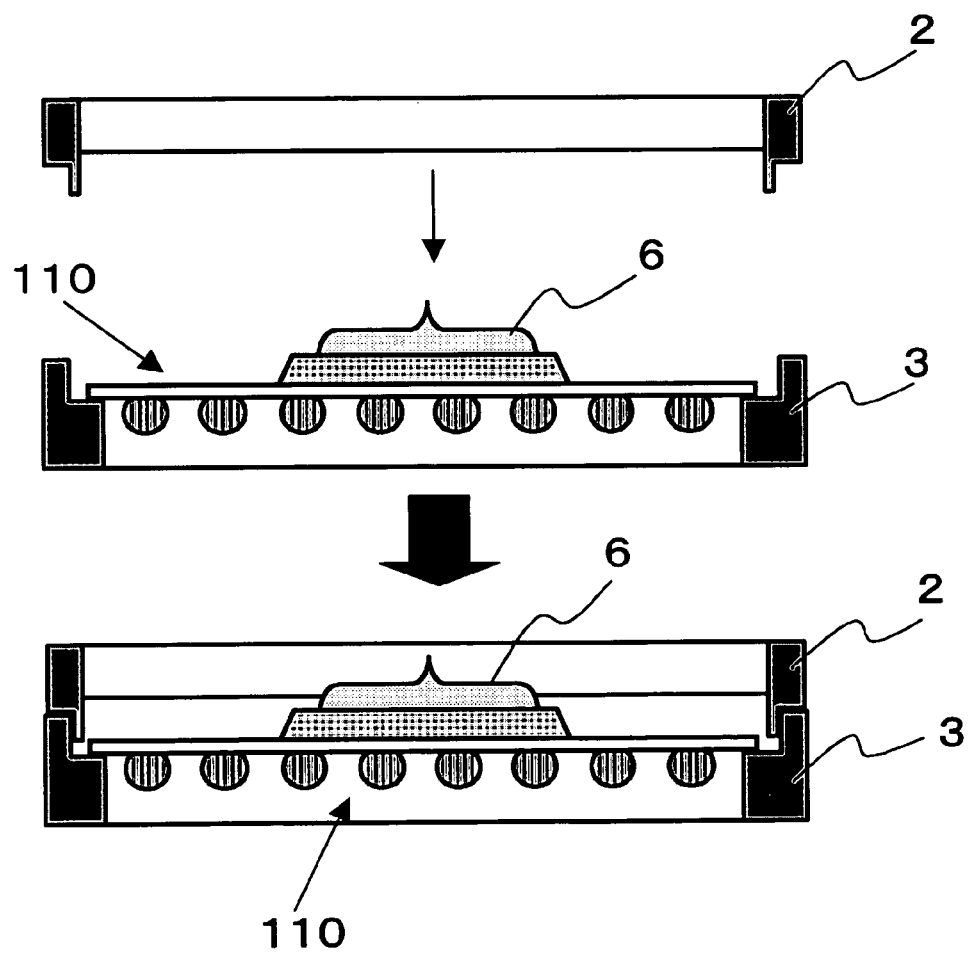
FIG. 16 shows the lower carrier 3 and the upper carrier 2.

Next, the first semiconductor device 110 accommodated in the lower carrier 3 is tested (step S2). In testing, the pins for testing of a probe 200 are connected to the first semiconductor device 110, and a power and test signals are supplied from the probe 200, as shown in FIG. 14. The opening 4 is provided on the bottom face of the lower carrier 3 so that the pins for testing may be inserted into. Therefore, the first semiconductor device 110 can be tested with accommodated in the lower carrier 3. If the original manufacturer carries out the above-mentioned test on the semiconductor device, only good products will be returned.

The first semiconductor device 110 is protected by the lower carrier 3 during a series of processes such as transportating to the original manufacturer of the semiconductor device, testing, and returning. It is thus possible to maintain the quality of the semiconductor device. Also, the testing is performed with accommodated in the lower carrier 3. This can make it possible to reduce the frequency of directly touching the first semiconductor device. As a result, the semiconductor device can be protected against external factors, and good products can be supplied to the next process.

Subsequently, the adhesive 6 is applied on the mold resin 112 that protects the IC chip with the use of a dispenser (step S3). An adhesive of thermosetting property is used for the adhesive 6. It is relatively easy to adjust the curing temperature and curing period of the adhesive of thermosetting property. Desired curing temperature and curing period can be set by employing the adhesive that satisfies the requirements in the semiconductor device to be manufactured. The adhesive of thermosetting property makes it possible to cure the adhesive spread into the inside of the semiconductor device without any troubles. This is different from a photo-curing adhesive in which only a portion exposed to ultraviolet light is cured. After the adhesive 6 is applied on the mold resin 112, the upper carrier 2 is located on the lower carrier 3. The engaging portions 5 are provided on both the upper carrier 2 and the lower carrier 3, and the upper carrier 2 is fixed with the lower carrier 3 by connecting the engaging portions 5 (step S4).

Figure 17:
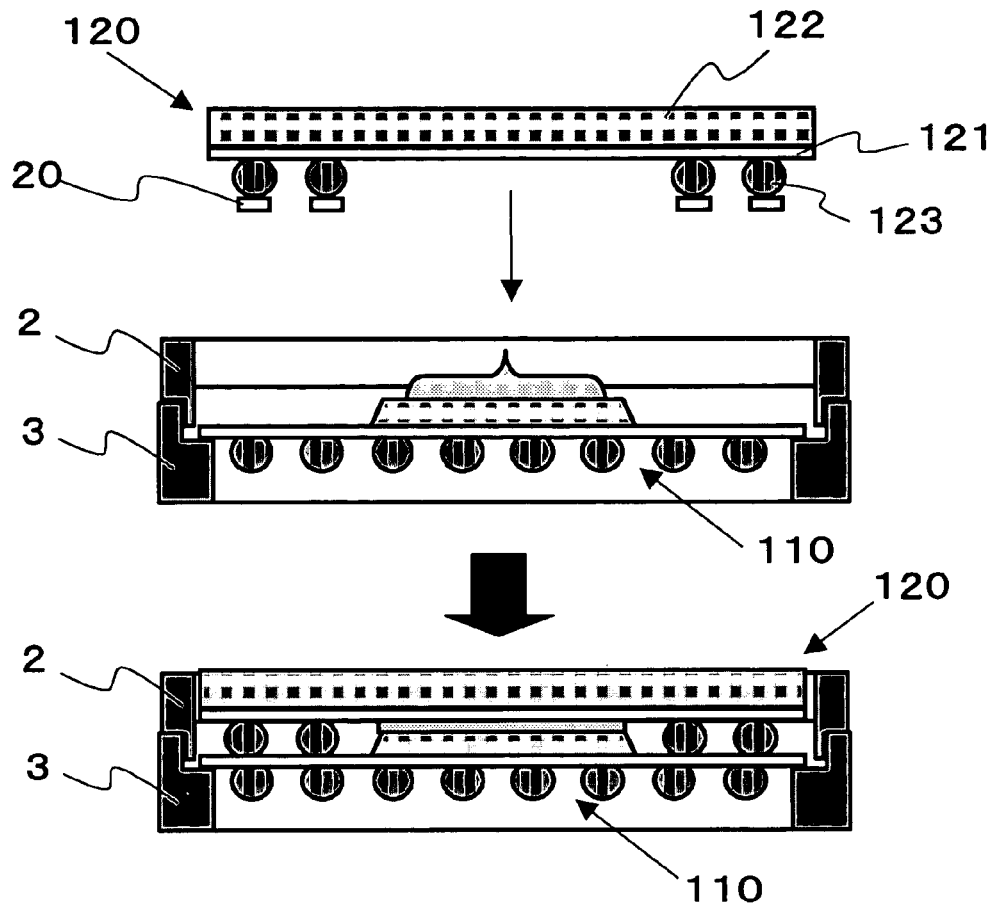
FIG. 17 shows the second semiconductor device 120 stacked on the first semiconductor device 110.

A flux 20 is applied on the solder balls 123 on the second semiconductor device 120 (step S5), as shown in FIG. 17. This process is performed only if the flux 20 has to be applied on the solder balls 123. FIG. 17 shows that the flux 20 is applied on the solder balls 123. However, the flux 20 may be applied on the gold electrode pads 8 on the first semiconductor device 110.

After the flux 20 is applied on the solder balls 123, the second semiconductor device 120 is mounted on the first semiconductor device 110 (step S5), as shown in FIG. 17. The second semiconductor device 120 is attached through the upper carrier 2 formed in the air. Here, the second semiconductor device 120 has to be attached on a given position on the first semiconductor device 110. That is to say, the gold electrode pads 8 of the first semiconductor device 110 have to be in contact with the solder balls 123 of the second semiconductor device 120 without fail. The upper carrier 2 serves as a guiding function, and the second semiconductor device 120 can be stacked on the first semiconductor device 110 readily and accurately.

Figure 18:
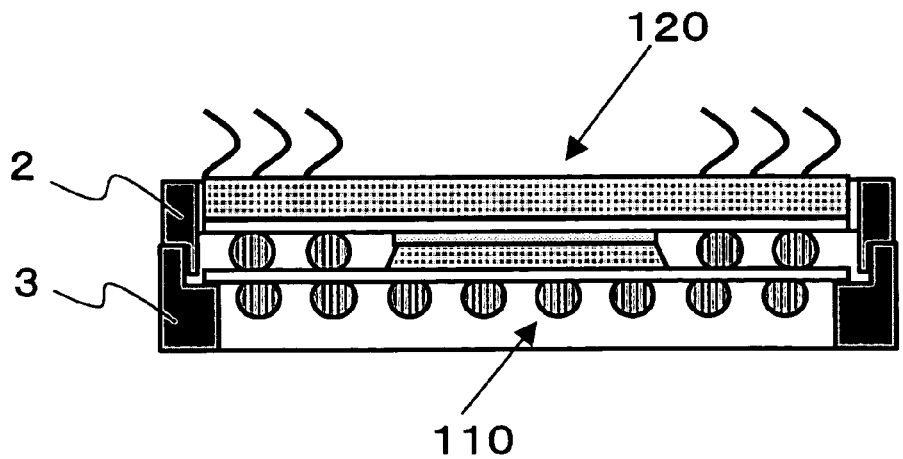
FIG. 18 shows a reflow soldering.

The second semiconductor device 120 is thus stacked, and then the stacked type semiconductor 100 that is accommodated in the upper carrier 2 and the lower carrier 3 is placed in a reflow chamber so that the reflow soldering may be performed (step S6), as shown in FIG. 18. The upper carrier 2 and the lower carrier 3 are made of any one of a plastic including one of a metal containing one of aluminum, copper or nickel such as SUS, ceramic and polyetherketone resin. The upper carrier 2 and the lower carrier 3 are capable of undergoing high temperatures in the reflow chamber and enduring repeated use.

Figure 19:
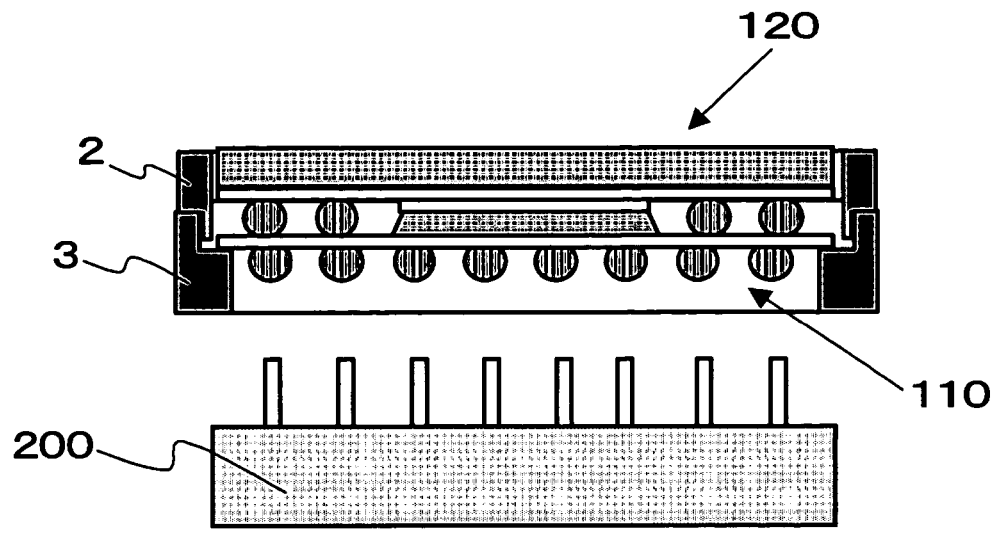
FIG. 19 is a view showing a test with a probe.
Figure 20:
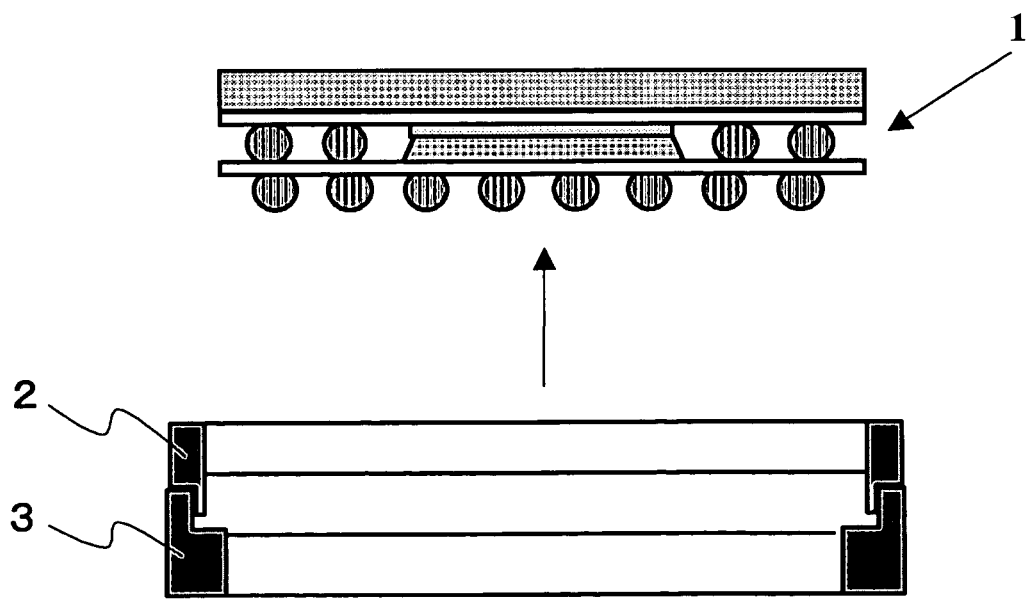
FIG. 20 is a view showing the stacked type semiconductor device removed from a carrier 1.

After the reflow soldering is completed, the flux 20 is washed off and the testing is carried out again (step S7). During this test, the pins for testing of the probe 200 are connected to the first semiconductor device 110, as shown in FIG. 19. Here, the second semiconductor device 120 is also tested, because the second semiconductor device 120 makes an electrical connection with the first semiconductor device 110.

The good products are thus judged. After the test, the upper carrier 2 and the lower carrier 3 are removed from the stacked type semiconductor device 100 for shipment (step S8).

Figure 21:
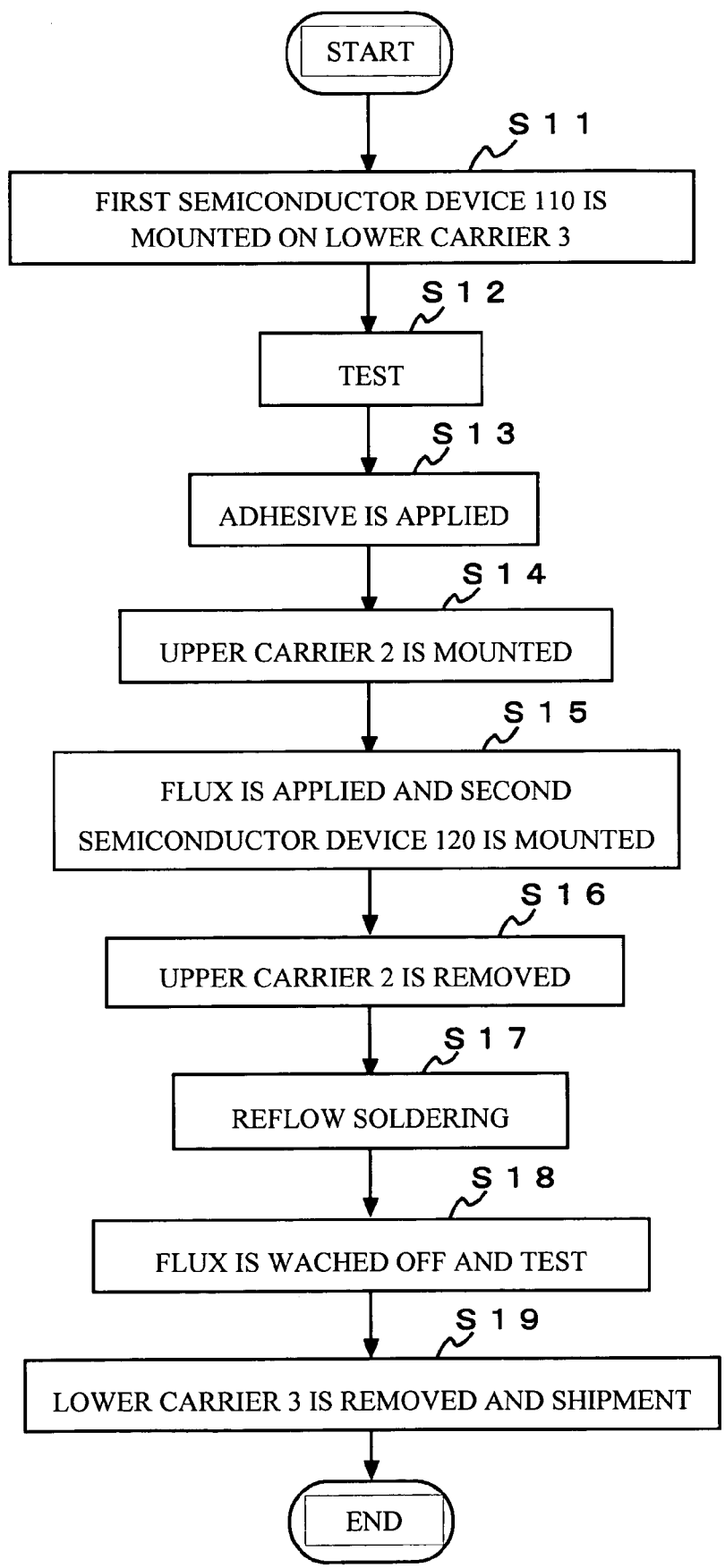
FIG. 21 is a flowchart showing another manufacturing process of the stacked type semiconductor device.

A description will now be given of a second example of the manufacturing procedure of the stacked type semiconductor device, with reference to a flowchart in FIG. 21.

Figure 22:
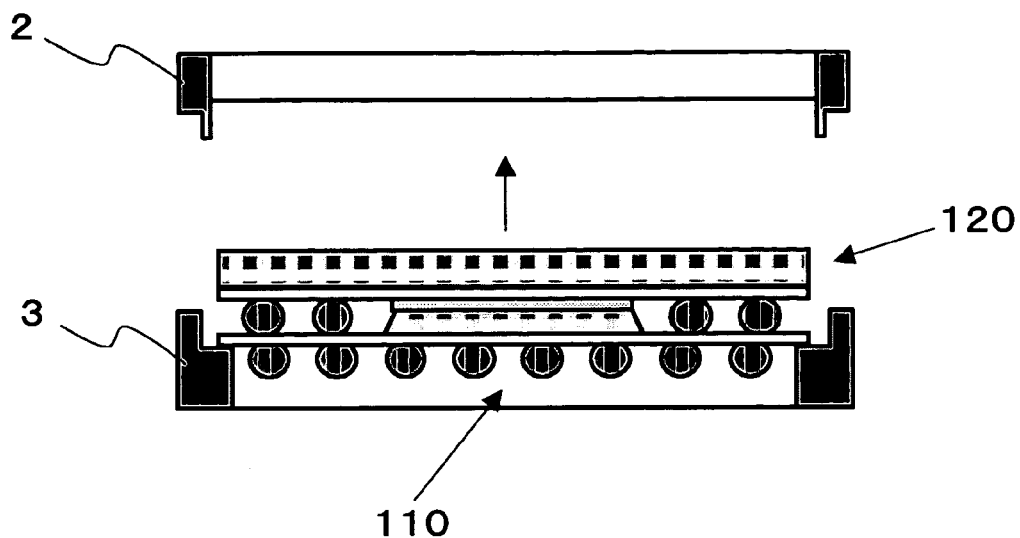
FIG. 22 is a view of removing the upper carrier after the second semiconductor device 12 is stacked.
Figure 23:
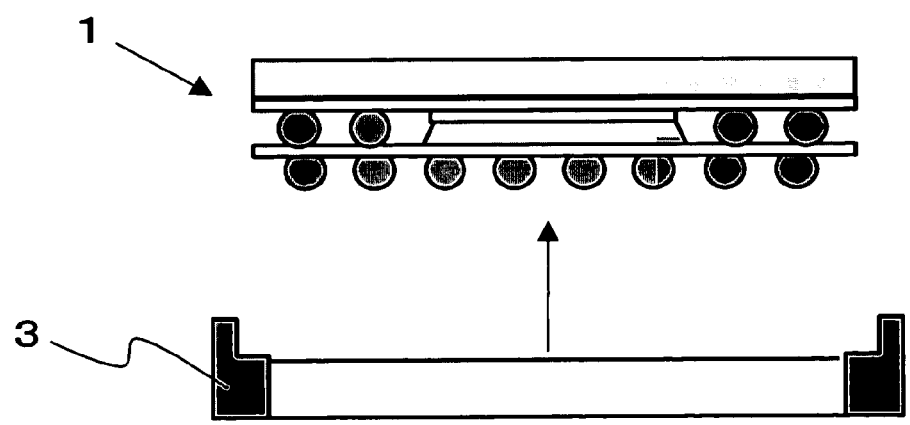
FIG. 23 is a view of removing the stacked type semiconductor device from the lower carrier 3.

The second example of the manufacturing procedure has the same procedure as the first one, until the second semiconductor device 120 is positioned and attached on the first semiconductor device 110. In the present example, after the second semiconductor device 120 is attached, the upper carrier 2 is removed from the lower carrier 3 (step S16), as shown in FIG. 22. The heat capacity of the whole carrier can be reduced by removing the upper carrier 2. This can prevent a problem of insufficient melting of solder due to insufficient temperature. Moreover, a lower temperature can be set in the reflow chamber, and thermal stress to the semiconductor device can be alleviated.

After the upper carrier 2 is removed, the reflow soldering is performed in the reflow chamber (step S17). Then, the flux is washed off and test is performed again, as described (step S18). The good products are thus judged. After the test, the lower carrier 3 is removed from the stacked type semiconductor device 100 for shipment (step S19).

Although a few preferred embodiments of the present invention have been shown and described, it would be appreciated by those skilled in the art that changes may be made in these embodiments without departing from the principles and spirit of the invention, the scope of which is defined in the claims and their equivalents. For example, the carrier 1 composed of the upper carrier 2 and the lower carrier 3 has been described. However, the configuration of the carrier is not limited to this. One carrier that has the guiding function and can accommodate multiple semiconductor devices therein may be employed. The carrier may be composed of multiple carriers.

What is claimed is:

1. A method of fabricating a stacked type semiconductor device comprising the steps of:
   placing a first semiconductor device in a lower carrier of a stacked type semiconductor device carrier;
   stacking a second semiconductor device on the first semiconductor device by using an upper carrier of the stacked type semiconductor device carrier; and
   fixing the first and second semiconductor devices together.

2. The method as claimed in claim 1, wherein the step of stacking comprises the steps of attaching the upper carrier to the lower carrier; and then placing the second semiconductor device in the upper carrier.

3. The method as claimed in claim 2, further comprising the step of making an electrical connection between the first and second semiconductor devices accommodated in the stacked type semiconductor device carrier in a reflow chamber so that the first and second semiconductor devices are incorporated.

4. The method as claimed in claim 3, further comprising a step of removing the upper carrier before the stacked type semiconductor device carrier is placed in the reflow chamber.

5. The method as claimed in claim 1, further comprising a step of connecting pins for testing to the first semiconductor device through an opening of the lower carrier and testing the first semiconductor device accommodated in the lower carrier.

6. The method as claimed in claim 1, further comprising a step of supplying an adhesive on a sealing resin of the first semiconductor device before the step of stacking.

7. The method as claimed in claim 6, wherein the sealing resin is thermosetting resin.

8. The carrier as claimed in claim 1, wherein:
   the second accommodating portion of the upper carrier has an inserting opening through which the second semiconductor device is accommodated in the upper carrier; and
   the inserting opening gradually becomes wider towards an upper end of the inserting opening.

9. A method of fabricating a stacked type semiconductor device comprising the steps of:
   placing a first semiconductor device in a lower carrier of a stacked type semiconductor device carrier; and
   stacking a second semiconductor device on the first semiconductor device by using an upper carrier of the stacked type semiconductor device carrier;
   wherein the lower carrier comprises a hold member made of an elastic material, the hold member holding the first semiconductor device in the first accommodating portion.

10. The carrier as claimed in claim 9, wherein the hold member holds side edges of the first semiconductor device.

* * * * *